(12) United States Patent
Nakamura et al.

(10) Patent No.: US 10,771,161 B2
(45) Date of Patent: Sep. 8, 2020

(54) OPTICAL TRANSMISSION MODULE

(71) Applicant: Lumentum Japan, Inc., Sagamihara, Kanagawa (JP)

(72) Inventors: Atsushi Nakamura, Nagano (JP); Shunya Yamauchi, Kanagawa (JP); Yoriyoshi Yamaguchi, Kanagawa (JP); Nozomu Yasuhara, Kanagawa (JP); Yoshihiro Nakai, Kanagawa (JP); Hideaki Asakura, Kanagawa (JP); Noriko Sasada, Kanagawa (JP); Takayoshi Fukui, Kanagawa (JP); Hiroki Irie, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 15/834,098

(22) Filed: Dec. 7, 2017

(65) Prior Publication Data

US 2019/0028204 A1    Jan. 24, 2019

(30) Foreign Application Priority Data

Jul. 19, 2017    (JP) .................................. 2017-139805

(51) Int. Cl.
*H04B 10/524* (2013.01)
*H04B 10/516* (2013.01)
(Continued)

(52) U.S. Cl.
CPC ........... *H04B 10/5161* (2013.01); *G02F 1/17* (2013.01); *H01S 5/0085* (2013.01);
(Continued)

(58) Field of Classification Search
CPC .. H04B 10/5161; H04B 10/69; H04B 10/524; H04B 10/5051; G02F 1/17;
(Continued)

(56) References Cited

U.S. PATENT DOCUMENTS

| | | | |
|---|---|---|---|
| 5,359,679 A | | 10/1994 | Tanaka et al. |
| 5,434,693 A | * | 7/1995 | Tanaka .................. G02F 1/0121 |
| | | | 372/26 |

(Continued)

FOREIGN PATENT DOCUMENTS

| | | |
|---|---|---|
| JP | 5-341242 A | 12/1993 |
| JP | 2001-221985 A | 8/2001 |

(Continued)

OTHER PUBLICATIONS

Quadir et al, A 56Gbs PAM4 VCSEL driver circuit, Jun. 2012, ISSC, Pages All Document.*

(Continued)

*Primary Examiner* — Dibson J Sanchez
(74) *Attorney, Agent, or Firm* — Harrity & Harrity, LLP (57) ABSTRACT

Provided is an optical transmission module which can generate PAM4 optical modulation signals without converting a plurality of binary electric signals to a multi-level electric signal. An optical transmission module (200) comprising: a light source (60) for emitting continuous waveform (CW) light; optical modulators (51,52,53) arranged in series with a path of the CW light configured to modulate the CW light by switching relatively large absorption and relatively small absorption of the optical modulators in response to a modulation signal applied to the respective optical modulators; and an arithmetic logic circuit (100) configured to receive a plurality of binary electrical signals, and then to perform logic operation on the plurality of binary electrical signals for generating a new plurality of binary electrical signals, wherein each of the new plurality of binary electrical signals is applied to the respective optical modulators as the modulation signal.

20 Claims, 5 Drawing Sheets

(51) Int. Cl.

| | |
|---|---|
| *H04B 10/69* | (2013.01) |
| *G02F 1/17* | (2019.01) |
| *H04Q 3/52* | (2006.01) |
| *H04Q 3/00* | (2006.01) |
| *H01S 5/00* | (2006.01) |
| *H04B 10/50* | (2013.01) |
| *H01S 5/026* | (2006.01) |
| *H01S 5/12* | (2006.01) |
| *H01S 5/042* | (2006.01) |
| *H01S 5/022* | (2006.01) |
| *G02F 3/00* | (2006.01) |

(52) U.S. Cl.
CPC ........ *H01S 5/0265* (2013.01); *H04B 10/5051* (2013.01); *H04B 10/524* (2013.01); *H04B 10/69* (2013.01); *H04Q 3/00* (2013.01); *H04Q 3/52* (2013.01); *G02F 3/00* (2013.01); *G02F 2203/48* (2013.01); *H01S 5/02276* (2013.01); *H01S 5/042* (2013.01); *H01S 5/12* (2013.01)

(58) Field of Classification Search
CPC ......... G02F 2203/48; G02F 3/00; H04Q 3/52; H04Q 3/00; H01S 5/0085; H01S 5/0265; H01S 5/12; H01S 5/042; H01S 5/02276
USPC .................. 398/135–172, 182–201
See application file for complete search history.

(56) References Cited

U.S. PATENT DOCUMENTS

| | | | | |
|---|---|---|---|---|
| 5,510,919 | A * | 4/1996 | Wedding | H04B 10/50 375/287 |
| 5,706,116 | A * | 1/1998 | Sugata | G02F 1/0121 359/245 |
| 5,706,117 | A * | 1/1998 | Imai | G02F 1/0123 372/29.02 |
| 5,751,455 | A * | 5/1998 | Shibutani | H04B 10/5051 398/1 |
| 6,271,950 | B1 * | 8/2001 | Hansen | H04B 10/505 375/308 |
| 6,381,056 | B1 * | 4/2002 | Ellis | H04B 10/25077 398/183 |
| 6,490,069 | B1 * | 12/2002 | Kahn | H04B 10/25137 398/183 |
| 6,678,479 | B1 | 1/2004 | Naoe et al. | |
| 7,149,256 | B2 * | 12/2006 | Vrazel | H04B 10/5161 375/295 |
| 7,734,189 | B2 * | 6/2010 | Ranganath | H04B 10/5053 359/254 |
| 9,172,472 | B2 * | 10/2015 | Daunt | H04B 10/5561 |
| 9,733,542 | B2 * | 8/2017 | Bai | G02F 1/225 |
| 9,746,698 | B2 * | 8/2017 | Goodwill | G02F 1/011 |
| 9,787,423 | B2 * | 10/2017 | Nagarajan | H04J 14/02 |
| 9,806,821 | B2 * | 10/2017 | Nakamura | H04B 10/541 |
| 9,900,021 | B1 * | 2/2018 | Elliott | H03M 1/66 |
| 9,933,639 | B1 * | 4/2018 | Lin | G02F 1/025 |
| 2001/0053165 | A1 * | 12/2001 | Wang | B82Y 20/00 372/38.02 |
| 2002/0171899 | A1 * | 11/2002 | Gurusami | H04L 25/49 398/141 |
| 2002/0195622 | A1 | 12/2002 | Ishimura | |
| 2003/0011854 | A1 | 1/2003 | Kahn et al. | |
| 2003/0057456 | A1 | 3/2003 | Wada | |
| 2004/0032646 | A1 * | 2/2004 | Koren | H01S 5/018 359/344 |
| 2004/0197106 | A1 * | 10/2004 | Noda | H04B 10/564 398/183 |
| 2005/0018732 | A1 * | 1/2005 | Bond | H01S 5/0265 372/50.1 |
| 2005/0025500 | A1 * | 2/2005 | Hallemeier | G02B 6/14 398/186 |
| 2005/0036791 | A1 * | 2/2005 | Gunn, III | G02F 1/025 398/183 |
| 2005/0275920 | A1 | 12/2005 | Sumi et al. | |
| 2005/0276615 | A1 * | 12/2005 | Ranganath | H01S 5/0265 398/183 |
| 2006/0120729 | A1 * | 6/2006 | Bai | H04B 10/5162 398/199 |
| 2007/0212076 | A1 * | 9/2007 | Roberts | H04B 10/548 398/183 |
| 2007/0230854 | A1 * | 10/2007 | Felix Keil | G02F 1/0121 385/1 |
| 2007/0230969 | A1 * | 10/2007 | Yutani | H04B 10/505 398/183 |
| 2007/0237444 | A1 * | 10/2007 | Keil | G02F 1/0121 385/3 |
| 2008/0089634 | A1 * | 4/2008 | Mosinskis | G02F 1/0121 385/3 |
| 2008/0095486 | A1 | 4/2008 | Shastri et al. | |
| 2010/0156679 | A1 * | 6/2010 | Ehrlichman | H04B 10/25891 341/50 |
| 2011/0044573 | A1 * | 2/2011 | Webster | G02F 1/0121 385/3 |
| 2011/0091221 | A1 * | 4/2011 | De Gabory | H04B 10/505 398/188 |
| 2012/0045163 | A1 * | 2/2012 | Wu | G02F 1/225 385/2 |
| 2012/0087653 | A1 * | 4/2012 | Sawada | H04B 10/5051 398/25 |
| 2012/0230626 | A1 * | 9/2012 | Metz | G02F 1/011 385/3 |
| 2012/0237160 | A1 * | 9/2012 | Shastri | G02F 1/0121 385/14 |
| 2013/0010343 | A1 * | 1/2013 | Hirayama | H01S 5/0265 359/238 |
| 2013/0176609 | A1 * | 7/2013 | Noguchi | H04B 10/5561 359/238 |
| 2013/0272700 | A1 * | 10/2013 | Satoh | H04B 10/50 398/45 |
| 2014/0169723 | A1 * | 6/2014 | Kato | G02F 1/0327 385/3 |
| 2014/0233962 | A1 * | 8/2014 | Kato | G02F 1/025 398/183 |
| 2014/0321864 | A1 * | 10/2014 | Bliss | H04B 10/541 398/186 |
| 2014/0369638 | A1 | 12/2014 | Doerr | |
| 2015/0063822 | A1 * | 3/2015 | Noguchi | G02F 1/0121 398/140 |
| 2015/0110500 | A1 * | 4/2015 | Noguchi | G02F 1/0316 398/142 |
| 2015/0249501 | A1 * | 9/2015 | Nagarajan | H04J 14/02 398/79 |
| 2015/0295650 | A1 * | 10/2015 | Lee | H04B 10/2575 398/115 |
| 2016/0103340 | A1 * | 4/2016 | Ding | G02F 1/035 385/2 |
| 2016/0164613 | A1 * | 6/2016 | Menezo | H04B 10/5161 398/115 |
| 2016/0365929 | A1 | 12/2016 | Nakamura et al. | |
| 2017/0090268 | A1 * | 3/2017 | O'Sullivan | G02F 1/3132 |
| 2017/0093513 | A1 * | 3/2017 | Nagarajan | H04B 10/40 |
| 2017/0310400 | A1 * | 10/2017 | Nagarajan | H04B 10/541 |
| 2019/0018262 | A1 * | 1/2019 | Nejadmalayeri | G02F 1/01 |

FOREIGN PATENT DOCUMENTS

| | | |
|---|---|---|
| JP | 2003-5141 A | 1/2003 |
| JP | 2003-98492 A | 4/2003 |
| JP | 2005-352219 A | 12/2005 |
| JP | 2010-507131 A | 3/2010 |
| JP | 2012-49801 A | 3/2012 |

(56) References Cited

FOREIGN PATENT DOCUMENTS

| | | |
|---|---|---|
| JP | 2017-003729 A | 1/2017 |
| JP | 2000-75254 A | 9/2018 |

OTHER PUBLICATIONS

Japanese Office Action received in corresponding Japanese Application No. 2015-116486 dated Sep. 25, 2018.

* cited by examiner

NOT (A AND B)

FIG.4B

NOT (A)

FIG.4C

NOT (A OR B)

FIG.5

OPTICAL TRANSMISSION MODULE

CROSS-REFERENCE TO RELATED APPLICATION

The present application claims priority from Japanese application JP 2017-139805, filed on Jul. 19, 2017, the content of which is hereby incorporated by reference into this application.

BACKGROUND OF THE INVENTION

1. Field of the Invention

The present invention relates to an optical transmission module.

2. Description of the Related Art

Recently, multi-level modulation such as PAM4 (Four Level Pulse Amplitude Modulation) have been intensively investigated for larger size transmission and higher transmission rate of data in an optical communication system. PAM4 utilizes light intensity of transmission signals with four intensity levels to realize 2 bit/baud of the transmission signals.

An Electro-Absorption Optical Modulator (EA modulator) or a laser diode integrated with the EA modulator monolithically (EA modulator laser diode) is used to generate PAM4 optical modulation signals. The EA modulator comprises a semiconductor quantum well structure sandwiched between a p-type conductor and an n-type conductor. The EA modulator controls output intensity of incident light by utilizing a shift of an optical absorption edge of the semiconductor quantum well structure to longer wavelength in response to application of a voltage to the semiconductor quantum well structure to change an amount of absorption of the incident light in the semiconductor quantum well structure. An optical signal generator comprising the EA modulator is proposed in JP2017-003729A, for example.

As mentioned in the previous paragraph, JP2017-003729A discloses the optical signal generator comprising the EA modulator. The optical signal generator comprises a plurality of modulation parts connected in series in a path of an optical signal, and adapted to generate a multilevel-coded modulated optical signal by modulating an intensity of an input optical signal from a light source based on a modulation signal using the modulation parts, and including an electro-absorption optical modulator provided to each of the modulation parts, and switched between an ON state of optical absorption and an OFF state of the optical absorption in accordance with the modulation signal, wherein regarding an extinction ratio of the ON state to the OFF state in each of the modulation parts, at least two of the modulation parts have respective values different from each other, and the modulation parts having the respective extinction ratios different from each other are located so that the lower the extinction ratio is, the closer to the light source the modulation part is located.

The plurality of modulation parts disclosed in JP2017-003729A generates a modulation signal by converting a plurality of binary electric signals to a multi-level electric signal. However, such conversion of the plurality of binary electric signals to the multi-level electric signal needs a dedicated IC, and thus makes the optical transmission module larger in size, and increase its power consumption.

SUMMARY OF THE INVENTION

Therefore, it is an object of the invention to provide an optical transmission module which can generate PAM4 optical modulation signals without converting a plurality of binary electric signals to a multi-level electric signal.

(1) An optical transmission module according to the invention comprises a light source for emitting continuous waveform (CW) light, optical modulators arranged in series with a path of the CW light configured to modulate the CW light by switching relatively large absorption and relatively small absorption of the optical modulators in response to a modulation signal applied to the respective optical modulators, and an arithmetic logic circuit configured to receive a plurality of binary electrical signals, and then to perform logic operation on the plurality of binary electrical signals for generating a new plurality of binary electrical signals, wherein each of the new plurality of binary electrical signals is applied to the respective optical modulators as the modulation signal.

(2) An optical transmission module according to (1) wherein each of the new plurality of binary electrical signals is applied to the respective optical modulators as the modulation signal by the arithmetic logic circuit.

(3) An optical transmission module according to (1) further comprises a driver for driving the optical modulators, wherein each of the new plurality of binary electrical signals is applied to the respective optical modulators as the modulation signal by the driver.

(4) An optical transmission module according to any one of (1)-(3) wherein the arithmetic logic circuit performs logic operation on the plurality of binary electrical signals based on a Gray code.

(5) An optical transmission module according to any one of (1)-(3) wherein the arithmetic logic circuit performs logic operation on the plurality of binary electrical signals based on a NRZ encoding.

(6) An optical transmission module according to any one of (1)-(5) wherein the light source and the optical modulators are integrated on one device.

BRIEF DESCRIPTION OF THE DRAWINGS

The invention will be described in detail with reference to the following drawings in which.

Like reference numerals designate the same or similar elements throughout all views so as to avoid any redundant description of the same or similar elements. It should be noted that the drawings are not to precise scale and may be exaggerated in thickness of lines or sizes of components for descriptive convenience and clarity only.

DETAILED DESCRIPTION OF THE INVENTION

First Embodiment

Figure 1:
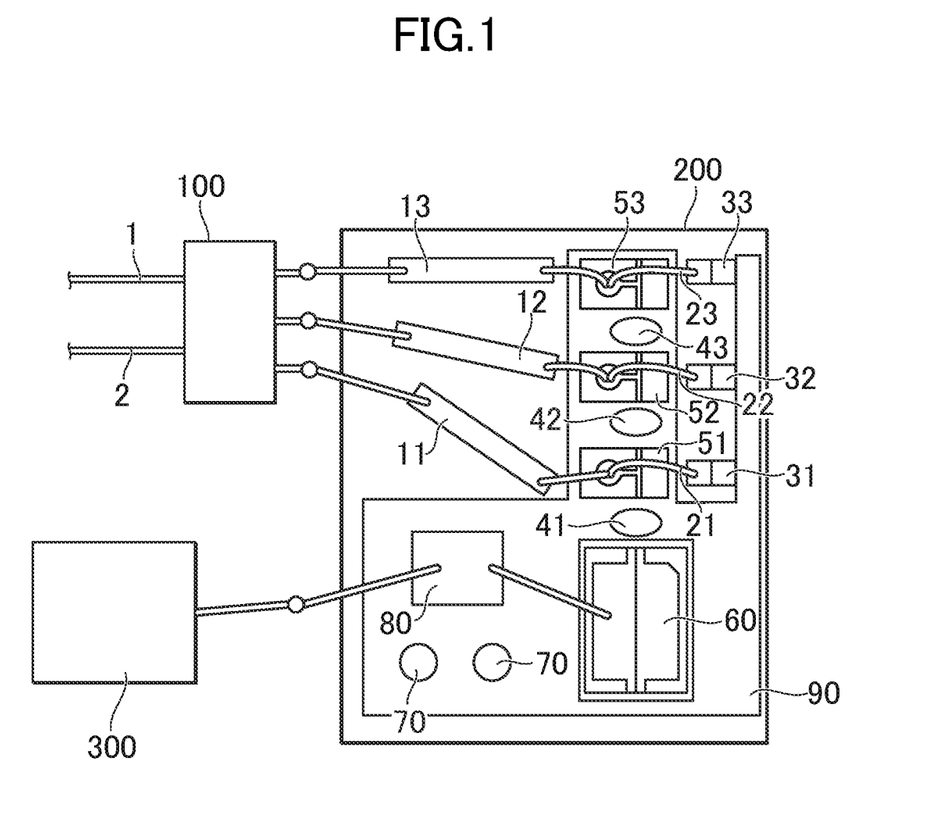
FIG. 1 shows one example of an optical transmission module according to an embodiment of the invention.

FIG. 1 shows one example of an optical transmission module according to an embodiment of the invention. The optical transmission module 200 comprises: a light source 60 for emitting CW light which is unmodulated; a first optical modulator 51, a second optical modulator 52, and a third optical modulator 53 arranged in series with a path of the CW light configured to modulate the CW light by switching relatively large absorption and relatively small absorption of the first, second and third optical modulators in response to a modulation electrical signal applied to the first, second and third optical modulators, respectively; and an arithmetic logic circuit 100 configured to receive a plurality of binary electrical signals, and then to perform logic operation on the plurality of binary electrical signals for generating a new plurality of binary electrical signals. Each of the new plurality of binary electrical signals is applied to the first optical modulator 51, the second optical modulator 52, and the third optical modulator 53 as the modulation signal. Three optical modulator are shown in FIG. 1. However, more than three optical modulator can be used.

The first optical modulator 51, the second optical modulator 52, the third optical modulator 53, the light source 60, via holes 70, and a chip capacitor 80 are disposed on a GND pattern 90. The via holes 70 are disposed so as to connect to a grounded back plane of the optical transmission module 200. Thus, the GND pattern 90 is grounded.

The light source 60 is preferably a Distributed Feedback Laser Diode (DFB-LD). However, the light source 60 is not limited to the DFB-LD. The light source 60 is a CW light source. The light source 60 can be operated by a driver 300. The chip capacitor 80 can be disposed between a current path connecting the light source 60 with the driver 300 and the GND pattern 90. The chip capacitor 80 prevents RF components in the new plurality of binary electrical signals applied to the respective optical modulators from flowing into the light source 60, and prevents the light source 60 from breaking by electrostatic discharge.

The first optical modulator 51, the second optical modulator 52, and the third optical modulator 53 are EA modulators. An EA modulator utilizes a change of optical absorption of a quantum well structure of the EA modulator with a modulation signal (electric field) applied to the quantum well structure to switch ON and OFF states of the EA modulator. Specifically, when a voltage is applied to the quantum well structure, potential energy of the quantum well structure changes. As a result, the quantum level of the conduction band of the quantum well structure shifts to lower and the quantum level of the valence band of the quantum well structure shifts to higher. In other words, the applied voltage narrows the effective energy gap of the quantum well structure to change optical absorption of the quantum well structure. The larger the applied voltage is, the more the optical absorption is. This change in the optical absorption of the quantum well structure with the applied voltage is known as Quantum Confined Stark Effect (QCSE).

The first optical modulator 51, the second optical modulator 52 and the third optical modulator 53 are arranged in series with the path of the CW light emitted from the light source 60. The first optical modulator 51 is located closest to the light source 60. The second optical modulator 52 is located on the side opposite to the light source 60 and adjacent to the first optical modulator 51. The third optical modulator 53 is located closest to the output end of the optical transmission module 200. To suppress divergence of output light from the light source 60, the first optical modulator 51 and the second optical modulator 52, a first lens 41 can be disposed between the light source 60 and the first optical modulator 51, a second lens 42 can be disposed between the first optical modulator 51 and the second optical modulator 52, and a third lens 43 can be disposed between the second optical modulator 52 and the third optical modulator 53. Although not shown in FIG. 1, the output light from the third optical modulator 53 is optically connected to an optical waveguide (e.g., an optical fiber, a receptacle) led to the exterior of the optical transmission module 200 via a lens, for example.

The arithmetic logic circuit 100 comprises a higher bit 1 and a lower bit 2 as inputs. The higher bit 1 and the lower bit 2 are binary electrical signals. The arithmetic logic circuit 100 is connected to the first optical modulator 51 and the second optical modulator 52 and the third optical modulator 53 via RF lines 11, 12 13 and Au wires 21, 22, 23, respectively. The first optical modulator 51, the second optical modulator 52 and the third optical modulator 53 are connected to thin-film resistors 31, 32, 33 as terminal resistors, respectively.

The arithmetic logic circuit 100 performs logic operation on binary electrical signals from the higher and lower bits 1, 2 to generate new binary electrical signals. Then, the new binary electrical signals are applied to the first optical modulator 51, the second optical modulator 52 and the third optical modulator 53 as modulation signals, respectively. The first optical modulator 51, the second optical modulator 52 and the third optical modulator 53 change the respective optical absorption in response to the applied modulation signals.

The optical transmission module 200 can further comprise a driver (not shown) for driving the first optical modulator 51, the second optical modulator 52 and the third optical modulator 53. The driver can amplify the modulation amplitude of the new binary electrical signals, or alter the modulation amplitude to a predetermined voltage, and then apply the modulation amplitude to the first optical modulator 51, the second optical modulator 52 and the third optical modulator 53. However, the optical transmission module 200 can operate without the driver because the modulation amplitude of the new binary electrical signals is small. Individual optical modulators having small extinction ratio can work.

The first optical modulator 51, the second optical modulator 52 and the third optical modulator 53 modulate the CW light from the light source 60 by changing the optical absorption of the first optical modulator 51, the second optical modulator 52 and the third optical modulator 53 in response to the new binary electrical signals applied to the first optical modulator 51, the second optical modulator 52 and the third optical modulator 53, respectively. In multi-level light intensity modulation, intensity difference between any two adjacent levels of the light intensity is preferably kept constant. Thus, extinction ratio of the first optical modulator 51, the second optical modulator 52 and the third optical modulator 53 is configured such that difference of the light intensity between the two adjacent levels of the light intensity is kept constant.

Table 1 shows a relationship between PAM4 light intensity (relative value) and extinction ratio. In order to assign four levels of the PAM4 light intensity (relative value) to, for example, 10, 7, 4 and 1, respectively, extinction ratio (unit:

dB) at each level should be configured with respect to the maximum light intensity and the next level as shown in Table 1. Throughout the description, unless explicitly noted, PAM4 relates to four-valued light intensity modulation signals.

TABLE 1

| PAM4 signal level | Light Intensity (relative value) | Extinction ratio with respect to the maximum light intensity (dB) | Extinction ratio with respect to the next level (dB) |
|---|---|---|---|
| 3 | 10 | 0.0 | — |
| 2 | 7 | 1.5 | 1.5 |
| 1 | 4 | 4.0 | 2.5 |
| 0 | 1 | 10.0 | 6.0 |

Table 2 shows a relationship between PAM4 signal levels and ON/OFF states of each EA modulator. As shown in Table 2, when a PAM4 signal level is zero (where the extinction ratio is the highest), all the EA modulators are set to the ON state (where the light is most absorbed); when the PAM4 signal level is one, the first optical modulator 51 and the second optical modulator 52 are set to the ON state while the third optical modulator 53 remains the OFF state (where the light is transmitted through the third optical modulator 53); when the PAM4 signal level is two, the first optical modulator 51 is set to the ON state while the second optical modulator 52 and the third optical modulator 53 remain the OFF state; and when the PAM4 signal level is three (where the extinction ratio is the lowest), all the EA modulators remain the OFF state (where the light is least absorbed).

All the EA modulators are set to the ON state when the PAM4 signal level is zero. Thus, the EA modulators attenuate (the light intensity of) the CW light from the light source 60. Only the first optical modulator 51 and the second optical modulator 52 are set to the ON state when the PAM4 signal level is one. Thus, only the first optical modulator 51 and the second optical modulator 52 attenuate the CW light from the light source 60. Only the first optical modulator 51 is set to the ON state when the PAM4 signal level is two. Thus, only the first optical modulator 51 attenuates the CW light from the light source 60. All the EA modulators remain the OFF state when the PAM4 signal level is three. Thus, no EA modulators attenuate the CW light from the light source 60. However, strictly speaking, the light intensity when the light is emitted from the light source 60 is different from the light intensity when the light is transmitted through the third optical modulator 53 because of coupling loss in the optical system of the optical transmission module 200 and slight optical absorption of each EA modulator. An amount of light extinction at each EA modulator is configured such that intensity ratio between any two adjacent PAM4 signal levels is constant by considering other extinction factors than the voltage applied to each EA modulator. Combination of the ON/OFF states of the EA modulators in this manner makes it possible to generate a multi-level modulations signal comprising a plurality of levels of the light intensity, such as a PAM4 signal. Therefore, in order to generate PAM4 light modulation signals, it is important to select the EA modulator(s) to be driven in response to binary electrical signals (a higher bit and a lower bit) input to the optical transmission module 200.

TABLE 2

| | ON/OFF of EAs | | |
|---|---|---|---|
| PAM4 signal level | EA 1 (closest to the light source) | EA2 | EA3 (closest to the output) |
| 3 | OFF | OFF | OFF |
| 2 | ON | OFF | OFF |
| 1 | ON | ON | OFF |
| 0 | ON | ON | ON |

Figure 2:
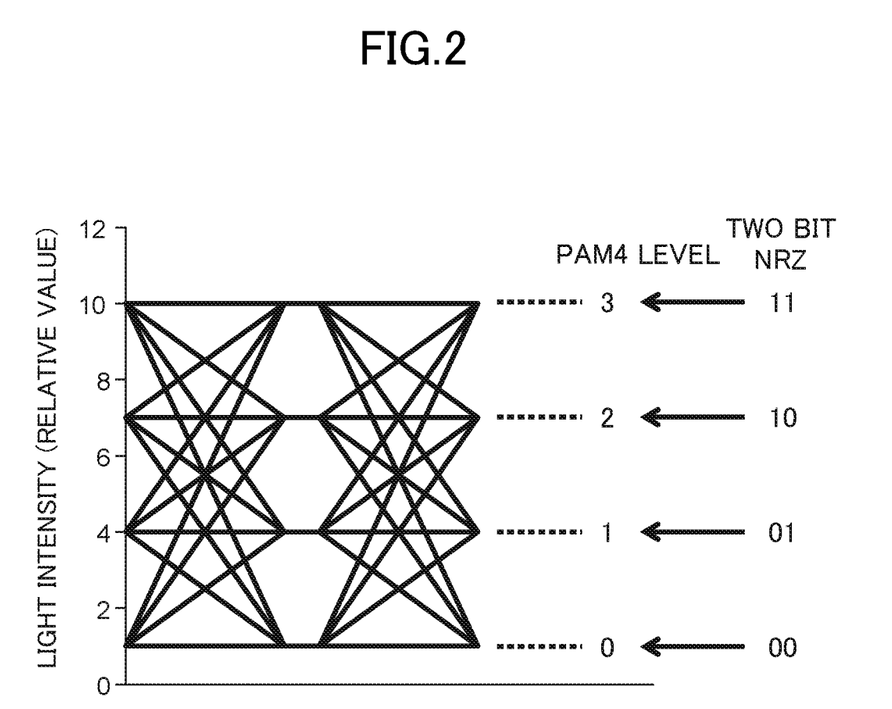
FIG. 2 shows correspondence among PAM4 signal levels (0,1,2,3), light intensity (relative value), and two-bit signals encoded by a NRZ encoding.

FIG. 2 shows correspondence among PAM4 signal levels (0,1,2,3), light intensity (relative value), and two-bit signals. Logical operation is performed on the two-bit signals shown in FIG. 2 in accordance with a NRZ encoding. As shown in FIG. 2, the two-bit signals correspond to PAM4 signal levels (0,1,2,3), and the PAM4 signal levels correspond to 1, 4, 7 and 10 of the light intensity (relative values).

Table 3 shows a relationship among higher and lower bits of two-bit signals, PAM4 signal levels (0,1,2,3), and states of the first optical modulator 51 (EA1), the second optical modulator 52 (EA2) and the third optical modulator 53 (EA3). Table 4 shows correspondence between new binary electrical signals generated in response to the higher and lower bits of the two-bit signals in Table 3 and then input to the EA1, and the operating (ON/OFF) states of the EA1. Likewise, Table 5 shows correspondence between new binary electrical signals generated in response to the higher and lower bits of the two-bit signals in Table 3 and then input to the EA2, and the operating (ON/OFF) states of the EA2. Table 6 shows similar correspondence for the EA3. As mentioned above, the arithmetic logic circuit 100 according to some embodiments is characterized by receiving the plurality of binary electrical signals (higher and lower bits), and then generating a new plurality of binary electrical signals (which is input to each EA).

As shown in Table 4, the arithmetic logic circuit 100 outputs zero only if one is input to both the higher and lower bits of the arithmetic logic circuit 100, then the EA1 does not absorb the CW light from the light source 60, and the CW light is transmitted through the EA1 and reaches the EA2. Otherwise, the arithmetic logic circuit 100 outputs one. Then, the EA1 receives the output from the arithmetic logic circuit 100 and operates in the ON state. In other words, the EA1 absorbs the CW light. As shown in Table 5, the arithmetic logic circuit 100 outputs one to the EA2 if zero is input to the higher bit, and outputs zero to the EA2 if one is input to the higher bit. As shown in Table 6, the arithmetic logic circuit 100 outputs one to the EA3 only if zero is input to both the higher and lower bits, and otherwise outputs zero to the EA3. In this manner, the arithmetic logic circuit 100 generates the new plurality of binary electrical signals depending on the values of the higher and lower bits, switches the ON/OFF states of the first optical modulator 51, the second optical modulator 52 and the third optical modulator 53 to generate a PAM4 light signal.

TABLE 3

| Higher bit of input | Lower bit of input | PAM4 signal level | EA 1 (closest to the light source) | EA2 | EA3 (closest to the output) |
|---|---|---|---|---|---|
| 1 | 1 | 3 | 0 (OFF) | 0 (OFF) | 0 (OFF) |
| 1 | 0 | 2 | 1 (ON) | 0 (OFF) | 0 (OFF) |
| 0 | 1 | 1 | 1 (ON) | 1 (ON) | 0 (OFF) |
| 0 | 0 | 0 | 1 (ON) | 1 (ON) | 1 (ON) |

TABLE 4

| Higher bit of input | Lower bit of input | New binary electrical signal input to EA1 | State of EA1 |
|---|---|---|---|
| 1 | 1 | 0 | OFF |
| 1 | 0 | 1 | ON |
| 0 | 1 | 1 | ON |
| 0 | 0 | 1 | ON |

TABLE 5

| Higher bit of input | Lower bit of input | New binary electrical signal input to EA2 | State of EA2 |
|---|---|---|---|
| 1 | 1 | 0 | OFF |
| 1 | 0 | 0 | OFF |
| 0 | 1 | 1 | ON |
| 0 | 0 | 1 | ON |

TABLE 6

| Higher bit of input | Lower bit of input | New binary electrical signal input to EA3 | State of EA3 |
|---|---|---|---|
| 1 | 1 | 0 | OFF |
| 1 | 0 | 0 | OFF |
| 0 | 1 | 0 | OFF |
| 0 | 0 | 1 | ON |

Figure 3:
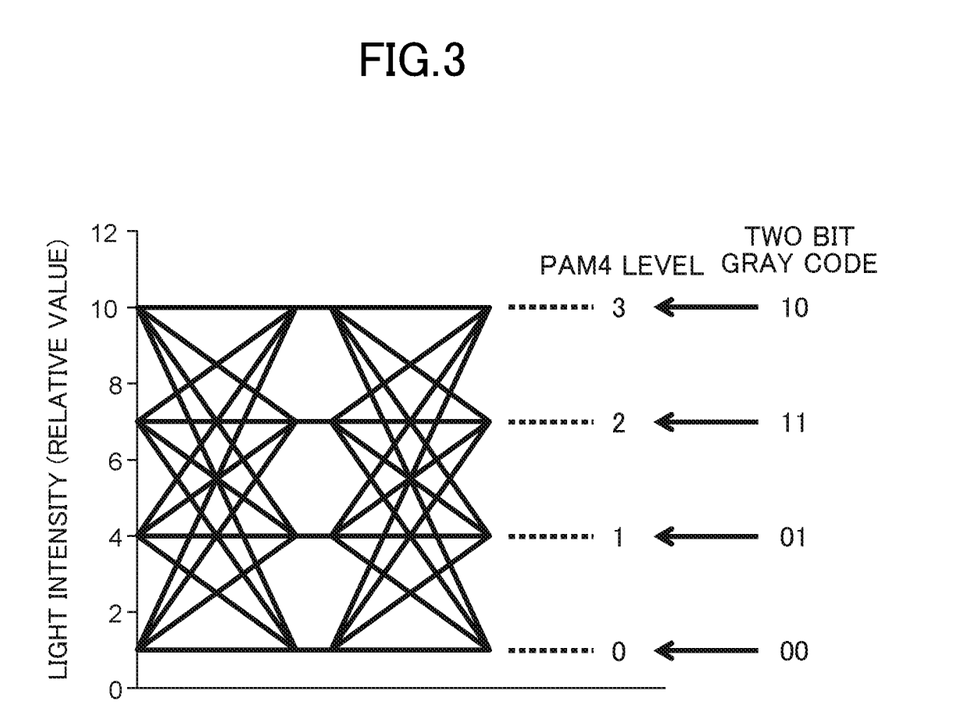
FIG. 3 shows correspondence among PAM4 signal levels (0,1,2,3), light intensity (relative value), and two-bit signals encoded by a Gray code.

FIG. 3 shows correspondence among PAM4 signal levels (0,1,2,3), light intensity (relative value), and two-bit signals. Logical operation on the two-bit signals shown in FIG. 3 is performed in accordance with a Gray code. As shown in FIG. 3, the two-bit signals correspond to PAM4 signal levels (0,1,2,3), and the PAM4 signal levels of light signals correspond to 1, 4, 7 and 10 of the light intensity (relative values) of the light signals.

Table 7 shows correspondence among higher and lower bits of two-bit signals, PAM4 signal levels (0,1,2,3), and states of the first optical modulator 51 (EA1), the second optical modulator 52 (EA2) and the third optical modulator 53 (EA3). Table 8 shows correspondence between new binary electrical signals generated in response to the higher and lower bits of the two-bit signals in Table 7 and then input to the EA1, and the operating (ON/OFF) states of the EA1. Likewise, Table 9 shows correspondence between new binary electrical signals generated in response to the higher and lower bits of the two-bit signals in Table 3 and then input to the EA2, and the operating (ON/OFF) states of the EA2. Table 10 shows similar correspondence for the EA3. As mentioned above, the arithmetic logic circuit 100 according to some embodiments is characterized by receiving the plurality of binary electrical signals (higher and lower bits), and then generating a new plurality of binary electrical signals (which is input to each EA).

As shown in Table 8, the arithmetic logic circuit 100 outputs zero only if one and zero are input to the higher and lower bits of the arithmetic logic circuit 100, respectively, then the EA1 does not absorb the CW light from the light source 60, and the CW light is transmitted through the EA1 and reaches the EA2. Otherwise, the arithmetic logic circuit 100 outputs one. Then, the EA1 receives the output from the arithmetic logic circuit 100 and operates in the ON state. In other words, the EA1 absorbs the CW light. As shown in Table 9, the arithmetic logic circuit 100 outputs one to the EA2 if zero is input to the higher bit, and outputs zero to the EA2 if one is input to the higher bit. As shown in Table 10, the arithmetic logic circuit 100 outputs one to the EA3 only if zero is input to both the higher and lower bits, and otherwise outputs zero to the EA3. In this manner, the arithmetic logic circuit 100 generates the new plurality of binary electrical signals depending on the values of the higher and lower bits, switches the ON/OFF states of the first optical modulator 51, the second optical modulator 52 and the third optical modulator 53 to generate a PAM4 light signal.

TABLE 7

| Higher bit of input | Lower bit of input | PAM4 signal level | EA 1 (closest to the light source) | EA2 | EA3(closest to the output) |
|---|---|---|---|---|---|
| 1 | 0 | 3 | 0 (OFF) | 0 (OFF) | 0 (OFF) |
| 1 | 1 | 2 | 1 (ON) | 0 (OFF) | 0 (OFF) |
| 0 | 1 | 1 | 1 (ON) | 1 (ON) | 0 (OFF) |
| 0 | 0 | 0 | 1 (ON) | 1 (ON) | 1 (ON) |

TABLE 8

| Higher bit of input | Lower bit of input | New binary electrical signal input to EA1 | State of EA1 |
|---|---|---|---|
| 1 | 0 | 0 | OFF |
| 1 | 1 | 1 | ON |
| 0 | 1 | 1 | ON |
| 0 | 0 | 1 | ON |

TABLE 9

| Higher bit of input | Lower bit of input | New binary electrical signal input to EA2 | State of EA2 |
|---|---|---|---|
| 1 | 0 | 0 | OFF |
| 1 | 1 | 0 | OFF |
| 0 | 1 | 1 | ON |
| 0 | 0 | 1 | ON |

TABLE 10

| Higher bit of input | Lower bit of input | New binary electrical signal input to EA3 | State of EA3 |
|---|---|---|---|
| 1 | 0 | 0 | OFF |
| 1 | 1 | 0 | OFF |
| 0 | 1 | 0 | OFF |
| 0 | 0 | 1 | ON |

Figure 4A:
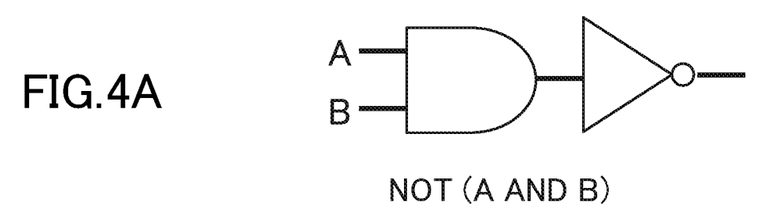
FIGS. 4A, 4B and 4C show examples of an arithmetic logic circuit configured to generate a binary electrical signal input to the optical modulators.
Figure 4B:
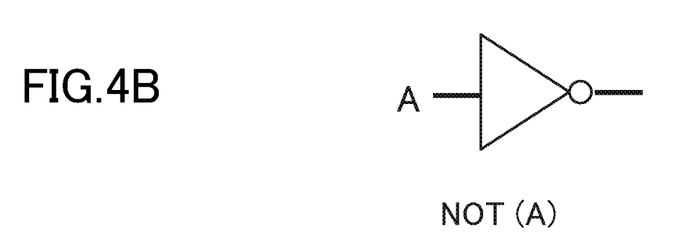
Figure 4C:
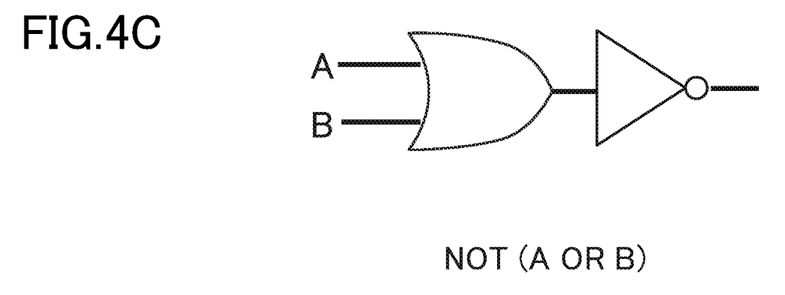

FIGS. 4A, 4B and 4C show examples of an arithmetic logic circuit configured to generate a binary electrical signal input to the optical modulators. In the circuits shown in FIGS. 4A, 4B and 4C, the symbols 'A', 'B' of each circuit correspond to higher and lower bits of an input, respectively, and the respective outputs of the circuits shown in FIGS. 4A, 4B and 4C correspond to the respective outputs to the first, second and third optical modulators, respectively.

FIG. 4A shows the circuit illustrating the relationship between the higher and lower bits shown in Table 4 and the output to the EA1. Specifically, FIG. 4A shows the circuit consisting of an AND circuit and a NOT circuit serially connected to the AND circuit. However, other forms of circuits can be contemplated. FIG. 4B shows the circuit illustrating the relationship between the higher and lower bits shown in Table 5 and the output to the EA2. Specifically, FIG. 4B shows the NOT circuit. However, other forms of circuits can be contemplated. FIG. 4C shows the circuit illustrating the relationship between the higher and lower bits shown in Table 6 and the output to the EA3. Specifically, FIG. 4C shows the circuit consisting of an OR circuit and a NOT circuit serially connected to the OR circuit. However, other forms of circuits can be contemplated. As shown in FIG. 4, unlike the prior art, the optical transmission module according to some embodiments can generate multi-level light modulation signals without generating multi-level electrical signals by using simple logic circuits to determine operating states of the EA modulators, and thus eliminate any large-scale arithmetic logic circuits.

Second Embodiment

Figure 5:
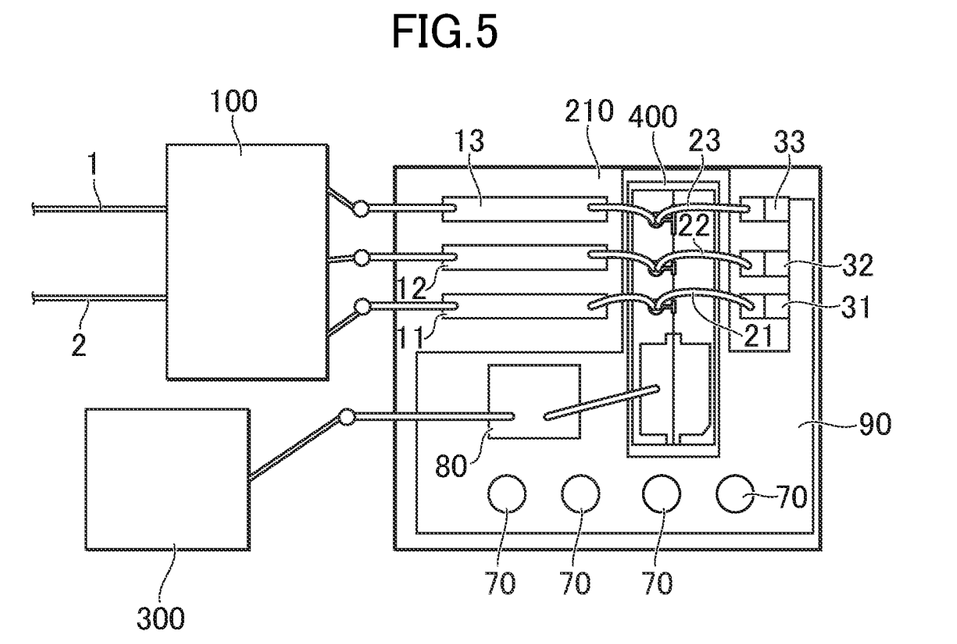
FIG. 5 shows other example of an optical transmission module according to an embodiment of the invention.

FIG. 5 shows other example of an optical transmission module according to an embodiment of the invention. The optical transmission module according to the present embodiment uses an EA modulator integrated DFB-LD on which a light source and three EA modulators are integrated as one body.

The optical transmission module according to some embodiments controls the ON/OFF states of the plurality of the optical modulators based on binary electrical signals input to the plurality of the optical modulators to generate PAM4 light modulation signals. Unlike the prior optical transmission module, the optical transmission module according to some embodiments can directly obtain multi-level light intensity modulation from binary electrical signals without converting binary electrical signals into multi-level electrical signals. In other words, the optical transmission module according to some embodiments eliminates any circuits to convert binary electrical signals into multi-level electrical signals, and thus comprises simple circuitry. As a result, increase in size and power consumption of the optical transmission module is suppressed. Furthermore, the optical transmission module according to some embodiments eliminates a step of converting binary electrical signals into multi-level electrical signals, and thus provides shorter latency.

The optical transmission module according to some embodiments eliminates conversion of binary electrical signals into multi-level electrical signals, and thus suppresses degradation of light signals to be transmitted. As a result, the optical transmission module according to some embodiments realizes more reliable signal transmission.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical transmission module comprising:
a light source for emitting continuous waveform (CW) light;
optical modulators arranged in series with a path of the CW light and configured to:
modulate the CW light by changing optical absorptions of the optical modulators based on modulation signals applied to the optical modulators;
a first lens disposed between the light source and the optical modulators to suppress divergence of the CW light from the light source;
a second lens disposed between a first optical modulator, of the optical modulators, and a second optical modulator of the optical modulators;
a ground (GND) pattern;
a plurality of via holes,
wherein the optical modulators, the light source, and the plurality of via holes are disposed on the GND pattern; and
an arithmetic logic circuit comprising a plurality of input ports and configured to:
receive a first plurality of one-bit electrical signals; and
perform a logic operation on the first plurality of one-bit electrical signals for generating a second plurality of one-bit electrical signals without converting the first plurality of one-bit electrical signals into a multi-level electrical signal,
wherein each of the second plurality of one-bit electrical signals is applied to a respective optical modulator, of the optical modulators, as a respective modulation signal of the modulation signals.

2. The optical transmission module of claim 1, wherein each of the second plurality of one-bit electrical signals is applied to the respective optical modulator as the respective modulation signal by the arithmetic logic circuit.

3. The optical transmission module of claim 1, further comprising:
a driver for driving the optical modulators,
wherein each of the second plurality of one-bit electrical signals is applied to the respective optical modulator as the respective modulation signal by the driver.

4. The optical transmission module of claim 1, wherein the arithmetic logic circuit, when performing the logic operation on the first plurality of one-bit electrical signals, is configured to:
perform the logic operation on the first plurality of one-bit electrical signals based on a Gray code.

5. The optical transmission module of claim 1, wherein the arithmetic logic circuit, when performing the logic operation on the first plurality of one-bit electrical signals, is configured to:
perform the logic operation on the first plurality of one-bit electrical signals based on a non-return-to-zero (NRZ) encoding.

6. The optical transmission module of claim 1, wherein the light source and the optical modulators are integrated on one device.

7. The optical transmission module of claim 1, wherein the arithmetic logic circuit is connected to each of the optical modulators.

8. The optical transmission module of claim 1, further comprising:
a driver for operating the light source.

9. The optical transmission module of claim 8, further comprising:
a chip capacitor disposed to connect the driver and the light source.

10. The optical transmission module of claim 9, wherein the chip capacitor is disposed on the GND pattern.

11. The optical transmission module of claim 1, further comprising:
a driver configured to:
amplify a modulation amplitude of the second plurality of one-bit electrical signals.

12. The optical transmission module of claim 1, further comprising:
a driver configured to:
alter a modulation amplitude of the second plurality of one-bit electrical signals to a predetermined voltage; and apply the modulation amplitude to the optical modulators.

13. The optical transmission module of claim 1, wherein each of the optical modulators is connected to a terminal resistor.

14. The optical transmission module of claim 1, further comprising:
a third lens disposed between the second optical modulator and a third optical modulator of the optical modulators.

15. A system comprising:
a light source for emitting light;
optical modulators configured to:
modulate the light by changing optical absorptions of the optical modulators based on modulation signals applied to the optical modulators;
a first lens disposed between the light source and the optical modulators to suppress divergence of the light from the light source;
a second lens disposed between a first optical modulator, of the optical modulators, and a second optical modulator of the optical modulators;
a ground (GND) pattern;
a plurality of via holes,
wherein the optical modulators, the light source, and the plurality of via holes are disposed on the GND pattern; and
an arithmetic logic circuit configured to:
receive a first plurality of one-bit electrical signals; and
perform a logic operation on the first plurality of one-bit electrical signals for generating a second plurality of one-bit electrical signals,
wherein each of the second plurality of one-bit electrical signals is applied to a respective optical modulator, of the optical modulators, as a respective modulation signal of the modulation signals.

16. The system of claim 15,
wherein the first lens is disposed between the first optical modulator and the light source.

17. The system of claim 15, further comprising:
a driver for operating the light source.

18. The system of claim 17, further comprising:
a chip capacitor disposed to connect the driver and the light source.

19. The system of claim 15, further comprising:
a driver for driving the optical modulators.

20. The system of claim 15, wherein the arithmetic logic circuit is connected to each of the optical modulators.

* * * * *